United States Patent [19]

Harel

[11] Patent Number: 5,198,810

[45] Date of Patent: Mar. 30, 1993

[54] ONE-WAY DATA TELEMETERING SYSTEM UTILIZING THE POWER SUPPLY MAINS

[75] Inventor: Giora Harel, Givat Avia, Israel

[73] Assignee: Unique Technology U.T. Ltd., Petah Tikva, Israel

[21] Appl. No.: 433,928

[22] Filed: Nov. 9, 1989

[30] Foreign Application Priority Data

Nov. 22, 1988 [IL] Israel ............................ 88443

[51] Int. Cl.⁵ .................................................. H04Q 1/00
[52] U.S. Cl. ................................ 340/870.13; 340/825.14; 340/310 A
[58] Field of Search .......... 340/310 R, 310 A, 870.13, 340/825.14

[56] References Cited

U.S. PATENT DOCUMENTS

| | | | |
|---|---|---|---|
| 3,895,369 | 7/1975 | Ono et al. ........................ | 340/310 R |
| 3,909,821 | 9/1975 | Jagoda et al. .................... | 340/310 R |
| 4,031,528 | 6/1977 | Harrison .......................... | 340/310 R |
| 4,097,692 | 6/1978 | Felix ............................ | 340/310 R X |
| 4,577,333 | 3/1986 | Lewis et al. ..................... | 340/310 R X |
| 4,642,637 | 2/1987 | Baer ............................. | 340/310 R X |
| 4,809,296 | 2/1989 | Braun et al. .................... | 340/310 R X |
| 4,845,466 | 7/1989 | Hariton et al. ................. | 340/310 R |

Primary Examiner—Donald J. Yusko
Assistant Examiner—Brian Zimmerman
Attorney, Agent, or Firm—Benjamin J. Barish

[57] ABSTRACT

A data telemetering system includes a plurality of remote transmitter units connected via an alternating current power supply mains to a central receiver. Each cycle of the line voltage is divided into a plurality of time slots, and each transmitter transmits its data in a separate time slot assigned to it. The data is binary multi-bit digital data, and one bit is transmitted by each transmitter in its assigned time slot during each cycle of the line voltage.

20 Claims, 3 Drawing Sheets

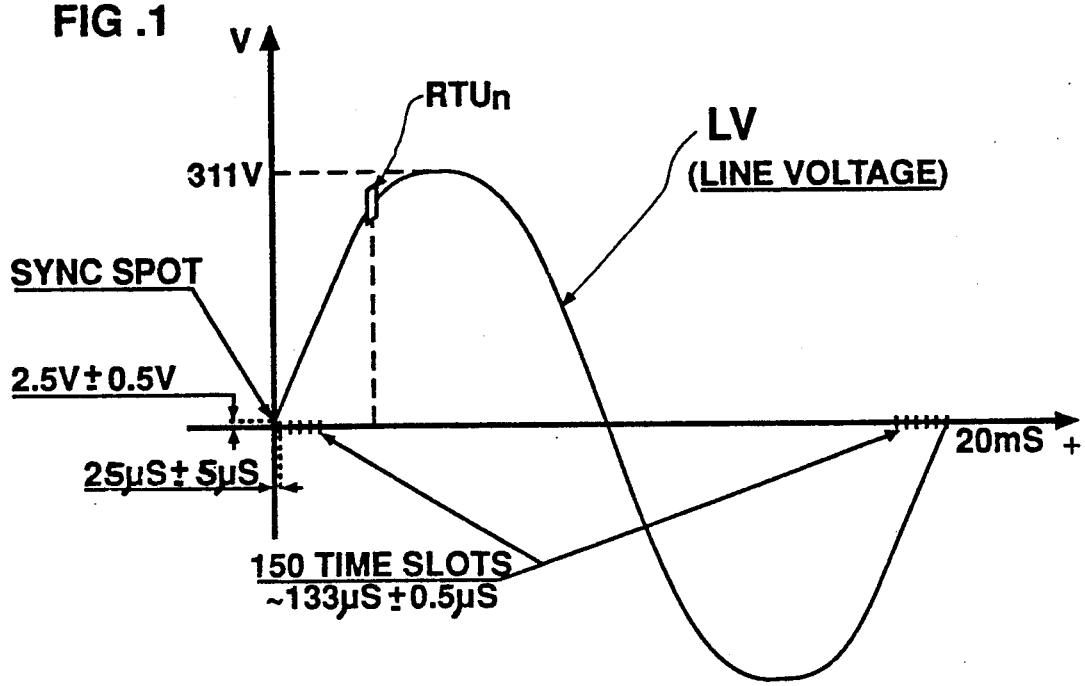
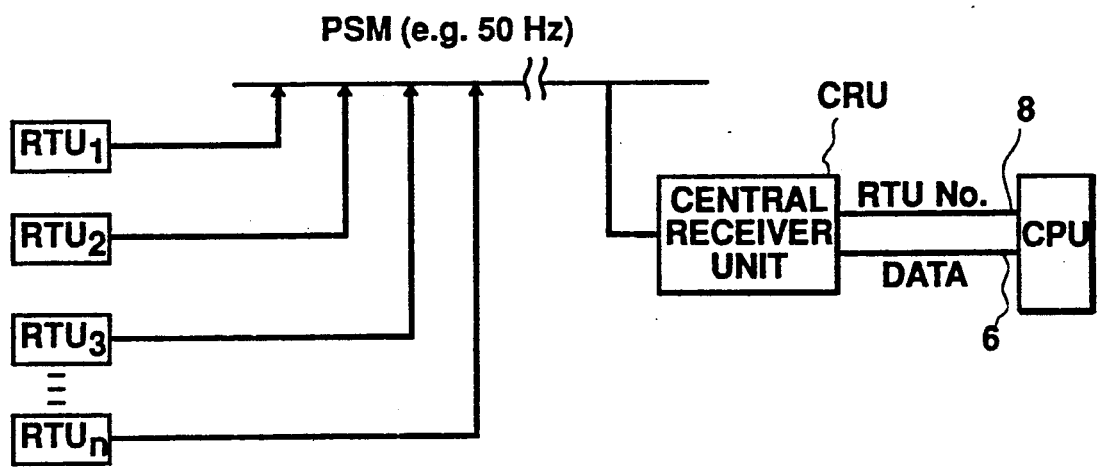

ONE-WAY DATA TELEMETERING SYSTEM UTILIZING THE POWER SUPPLY MAINS

BACKGROUND OF THE INVENTION

The invention relates to system for telemetering data. The invention is particularly useful for telemetering the data of, e.g., electrical consumption meters, and is therefore described below with respect to this application.

The modern world functions by means of electrical energy distributed via power supply mains generally operating at an alternating line voltage of 50 or 60 Hz. Most modern equipment is powered by such power supply mains, whereas data communication is usually effected via other channels.

It would be highly desirable to use the power supply mains as the common communication medium, by multiplexing the data from a plurality of consumers to a central receiver. However, such a system requires synchronization between the consumer transmitters and the receiver. This means the transmitter would need a receiver which is very sensitive, narrow-band, and equipped with noise-rejection and error coding/decoding circuitry, and which would therefore make the system very costly.

OBJECTS AND SUMMARY OF THE INVENTION

An object of the present invention is to provide a low-cost telemetering system which enables data from a large number of remote transmitter units to be transmitted to a central receiver unit via the power supply mains without the need for a receiver in the remote transmitter units for receiving synchronization signals from the central receiver.

According to the present invention, there is provided a telemetering system comprising: transmitter apparatus including a plurality of remote transmitter units connected via an alternating current power supply mains to a receiver apparatus including a central receiver unit for receiving data from the remote transmitter units; the transmitter apparatus comprising divider means for dividing each cycle of the line voltage into a plurality of time slots, detector means for detecting a predetermined point of each cycle of the line voltage to determine the start point of the first time slot, and transmitter means for transmitting to the power supply mains the data of each of the remote transmitter units in a separate time slot assigned to the respective unit; the central receiver unit comprising divider means synchronized by each cycle of the line voltage for dividing each cycle into a plurality of time slots corresponding to those of the transmitter apparatus detector means for detecting a predetermined point of each cycle of the line voltage to determine the start point of the first time slot, and receiver means for separately receiving the data in the time slot of each respective remote transmitter unit; each of the transmitter units transmitting at least one bit of binary multi-bit digital data in its assigned time slot during each cycle of the line voltage of the power supply mains.

For example, a line voltage of 50 Hz may be divided into at least 50, preferably about 150, time slots and may therefore be used for telemetering data from many remote transmitter units to a central receiver unit.

It will thus be seen that, in such a system, the data may be transmitted one way from each remote terminal unit to the central receiver without the need for receiving a synchronization pulse from the receiver. Accordingly, each such remote transmitter unit may be constructed inexpensively as compared to other telemetering systems requiring each transmitter unit to be equipped with a receiver for receiving a synchronization pulse from the receiver.

BRIEF DESCRIPTION OF THE DRAWINGS

FIG. 1 is a line synchronization timing diagram helpful in understanding the present invention;

FIG. 2 is a block diagram illustrating one form of telemetering system constructed in accordance with the present invention;

DESCRIPTION OF A PREFERRED EMBODIMENT

Figure 3:
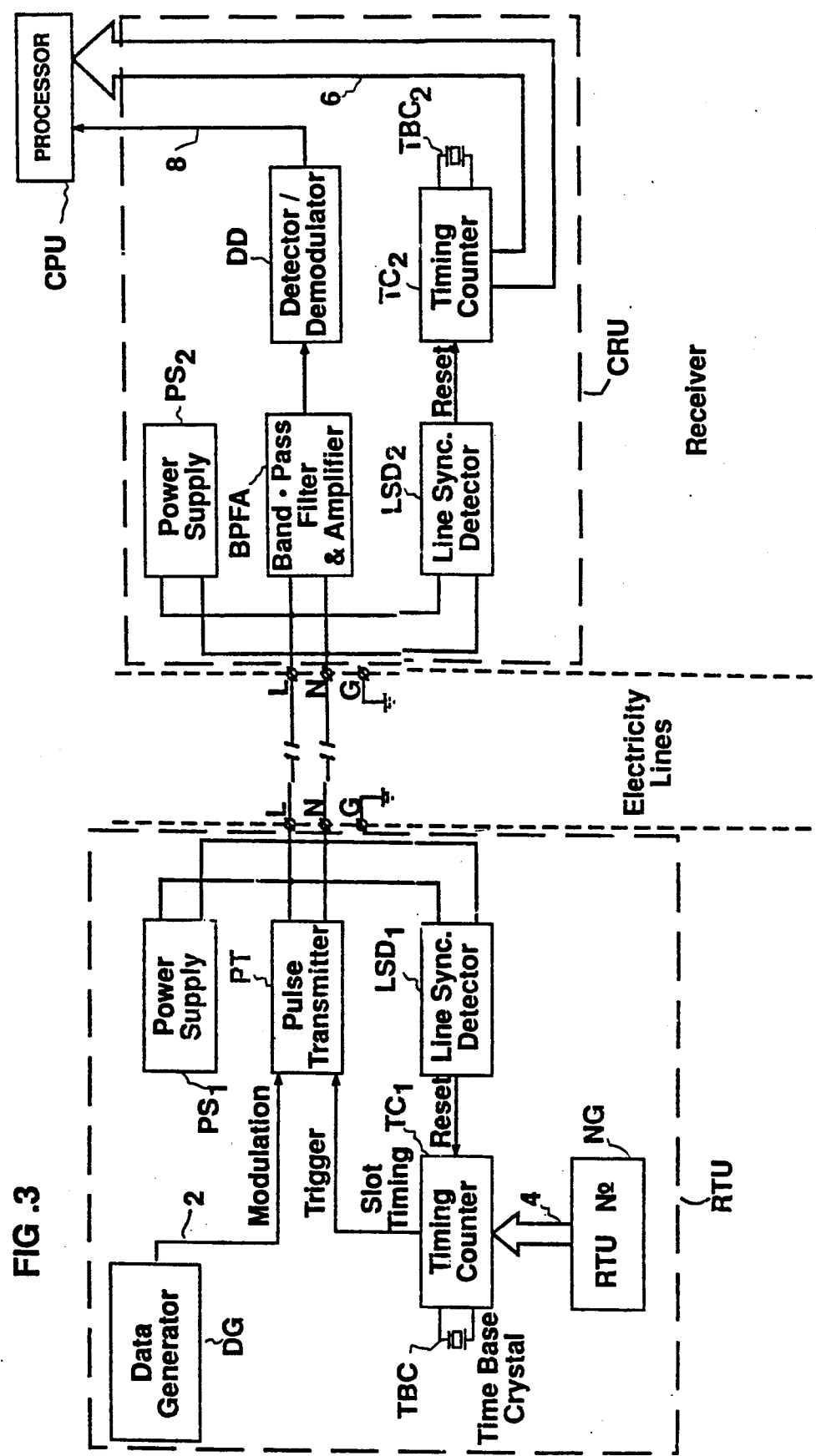
FIG. 3 is a block diagram illustrating the transmitter control apparatus for transmitting the data from the remote transmitter units into the power supply mains, and the central receiver unit for detecting the data of all the remote transmitter units.

As briefly described above, the telemetering system and method of the invention utilize the common power supply means operating at an alternating line voltage of, e.g., 50 or 60 Hz, for transmitting the data from a plurality of remote transmitter units (e.g., electrical power consumption meters), to a central receiver unit.

For example, FIG. 1 illustrates one cycle of the line voltage in a 220 volt, 50 Hz power supply, wherein it will be seen that the peak voltage is 311 v. By the use of a simple digital gate, having a relatively non-accurate and unstable input threshold of 2.5 v ± 1 v, the minimum threshold detecting time after the absolute zero crossing point, may be computed as follows:

$$\text{Arcsin} \frac{2.5v - 1v}{311v} \times \frac{1}{360°} \times \frac{1}{50 \text{ Hz}} = 15.4 \, \mu\text{Sec} \quad \text{(Eq. 1)}$$

The maximum threshhold detecting time may be computed as follows:

$$\text{Arcsin} \frac{2.5v + 1v}{311v} \times \frac{1}{360°} \times \frac{1}{50 \text{ Hz}} = 35.8 \, \mu\text{Sec} \quad \text{(Eq. 2)}$$

This means that there is an uncertainty of 20 μSec, or 0.1% (1/1,000) of the cycle duration or cycle.

If a better detector is used (e.g., the 74 HC series) the variation of threshold may be decreased by one-tenth, which would thereby reduce the uncertainty to 2 μSec, or 0.01% (1/10,000) of the cycle.

Delays caused by limited signal velocity along long lines are also to be added to the uncertainty margin. For example, in a low-voltage-transformer distribution apparatus, in which the most distant points may reach 2 Km, and the electromagnetic signal speed is around 0.7 C (C=light velocity in vacuum), there may be a delay of:

$$\frac{2 \text{ Km}}{0.7 \times 3 \times 10^5 \text{ Km/Sec}} = 9.5 \, \mu\text{S} \quad \text{(Eq. 3)}$$

to produce a total uncertainty margin of approximately 0.06%.

In the example illustrated in FIG. 1, the time slot width was selected to be approximately 133 μS, which is ten times the uncertainty margin, enabling 150 remote transmitter units to be multiplexed on the line voltage of the power supply mains.

The apparatus may be synchronized with respect to any predetermined point of the cycle or cycle of the line voltage of the power supply mains, which predetermined point serves as the reference point for dividing the cycle into the plurality of time slots. For example, the reference point may be the rising zero-crossing point of the cycle, the falling zero-crossing point of the cycle, or any predetermined point inbetween.

FIG. 1 illustrates the line synchronization timing when using a line voltage of 50 Hz, such that each cycle is approximately 20 ms. In this example, the rising zero-crossing point is used as the reference point, and the complete cycle is divided into 150 time slots from the reference point, with each time slot being approximately 133 $\mu S \pm 0.5$ $\mu S$. Thus, the supply mains may be used for multiplexing the data of 150 remote transmitter units to a central receiver unit.

It is possible to synchronize the apparatus on both the rising and falling zero-crossing points. This would enable the use of a non-polarity transmitter, which is simple to install, but would provide one-half (i.e., 75) the number of time slots, and therefore one-half the number of remote transmitter units that may be multiplexed.

FIG. 2 is a block diagram illustrating one form of telemetering system constructed in accordance with the invention.

As shown in FIG. 2, the system comprises transmitter apparatus including a plurality of remote transmitter units, $RTU_1$ - - - $RTU_n$, which transmit their data to the power supply means PSM. Each transmitter unit includes divider means, synchronized by the line voltage of the power supply mains, for dividing each cycle of the line voltage into a plurality of time slots, and transmitter means for transmitting to the power supply mains PSM the data of the respective remote transmitter unit $RTU_1$ - - $RTU_n$, in a separate time slot assigned to the respective RTU. Thus, each RTU generates the data to be transmitted, this data appearing on line 2 (FIG. 3), and also generates the RTU number, appearing on line 4, identifying the respective unit.

The receiver apparatus at the receiver end of the power supply mains PSM includes a central receiver unit CRU which receives the data multiplexed in the various time slots of the line voltage of the power supply mains PSM, and separately detects or receives the data in the time slot of each respective remote transmitter unit $RTU_1$ - - $RTU_n$. Thus, the central receiver unit CRU outputs both the data, via line 6, extracted from the power mains PSM, and the number, via line 10, of the remote transmitter unit $RTU_1$ - - $RTU_n$ corresponding to the time slot from which the data was extracted. The information outputted by the CRU may be processed in any desired manner, for example by means of a central processor unit CPU, for billing, statistical, or other purposes.

FIG. 3 more particularly illustrates the construction of each remote transmitter unit $RTU_1$ - - $RTU_n$ at the transmitter end of the power supply means PSM, and the structure of the central receiver unit CRU at the receiver end.

Thus, each remote transmitter unit $RTU_1$ - - $RRU_n$ includes a data generator DG which generates the data to be transmitted, this data appearing on line 2. Each unit also generates its RTU number via a number generator NG, this number appearing on line 4. The RTU data appearing on line 2 may be generated in the respective unit in any known manner, e.g., by the use of an optical sensor, a magnetic sensor, or the like. This data may be transmitted continuously, or it may be stored in a storage device and transmitted periodically, e.g., every hour. The RTU number inputted via line 4 may be generated from a register, memory, or fixed by wired jumpers.

Each remote transmitter unit $RTU_1$ - - $RTU_n$ illustrated in FIG. 3 comprises divider means including a line synch detector $LSD_1$ and a timing counter $TC_1$ for dividing each cycle of the power supply mains line voltage into a plurality of time slots. Each unit also comprises transmitter means including a pulse transmitter PT for transmitting to the power supply mains the data of each of the remote transmitter units $RTU_1$ - - $RTU_n$, as inputted via line 2, in a separate time slot assigned to the respective remote transmitter unit, as determined by the RTU number inputted via line 4.

The line synch detector $LSD_1$ detects a predetermined point on each cycle of the line voltage to serve as the reference point for dividing the cycle into the plurality of time slots. In the example illustrated in FIG. 1, this reference point is the rising zero-crossing point of the line voltage cycle, and each cycle is divided into 150 time slots each having a width of approximately 133 uS. The line synch detector $LSD_1$ detects the rising crossover point and outputs a reset pulse to the timing counter $TC_1$ at that instant.

Timing counter $TC_1$ is controlled by a stable oscillator, such as a time base crystal TBC, which provides the basic time clock for dividing the voltage cycle into the predetermined number of time slots, in this case 150 time slots. Timing counter $TC_1$ receives the RTU number via input line 4 and produces, at the beginning of the time slot corresponding to the inputted RTU number, a trigger pulse which is applied to the pulse transmitter PT.

Pulse transmitter PT generates a burst of high frequency pulses when triggered by the trigger pulse from the timing counter $TC_1$. For example, the pulse transmitter may operate at a frequency of 90 KHz. The data multiplexed into the power supply mains PSM is in the form of multi-bit serial digital data, with one bit being injected during each separate cycle of the line voltage. Thus, as one example, pulse transmitter PT may inject a burst of pulses of 90 KHz when the injected bit represents a "1", and no pulses when the injected bit represents a "0", it being appreciated that the bit is injected into the power supply mains at the time slot corresponding to the RTU number.

Many other arrangements may be used for injecting the data for each remote transmitter unit $RTU_1$ - - $RTU_n$ into the respective time slot of the voltage cycle of the power supply mains. For example, an "0" could be represented by transmitting pulses of one frequency (e.g., 90 KHz), and a "1" could be represented by transmitting pulses of another frequency (e.g., 120 KHz). Another arrangement, involving redundancy, would be to transmit no pulses to represent a "0", and pulses of two frequencies, e.g., 90 KHz and 120 KHz, to represent a "1", such that if the bit cannot be properly read in one frequency, it may be read in the other frequency. A still further alternative would be to modulate the pulses injected by the pulse transmitter PT, e.g., amplitude, frequency or time-width modulation.

As described earlier, one bit of the data is injected into the line voltage of the power supply mains PST for each time slot during each cycle of the line voltage. Accordingly, if the data is a word of eight bits, eight line voltage cycles would be necessary to telemeter the data.

Each remote transmitter unit $RTU_1$--$RTU_n$ also includes a power supply $PS_1$ for supplying the power to the various components of the remote transmitter unit. The power supply $PS_1$, however, is a passive power supply, and does not have a separate power source but rather derives its energy from the power supply mains PSM.

The central receiver unit CRU illustrated in FIG. 3 also utilizes the line voltage of the power supply mains PSM for synchronization purposes. Thus, it also includes a line sync detector $LSD_2$ which detects the same predetermined point on each cycle of the line voltage as detected in the remote transmitter units $RTU_1$--$RTU_n$, namely the rising zero-crossing point, to serve as the reference point for dividing the cycle into the same number of time slots, namely 150 time slots in this example. The central receiver unit CRU also includes a timing counter $TC_2$ periodically reset by the Reset Pulse from the line sync detector $LSD_2$, corresponding to the assigned slot number of the data detected by the central receiver unit CRU. Timing counter $TC_2$ outputs, via line 8, the RTU number of the detected data.

The data itself is filtered by a band pass filter and amplifier BPFA which passes only the frequency of the pulse transmitter PT in the remote transmitter units $RTU_1$--$RTU_n$, and amplifies these pulses. The amplified pulses are then fed to a detector/demodulator DD which extracts the data and outputs it via line 6 to the central processor unit CPU, with the RTU number outputted via line 8.

The central receiver unit CRU also includes a passive power supply $PS_2$ which derives its energy from the power supply mains PSM in order to power the various components of the central receiver unit.

Figure 4:
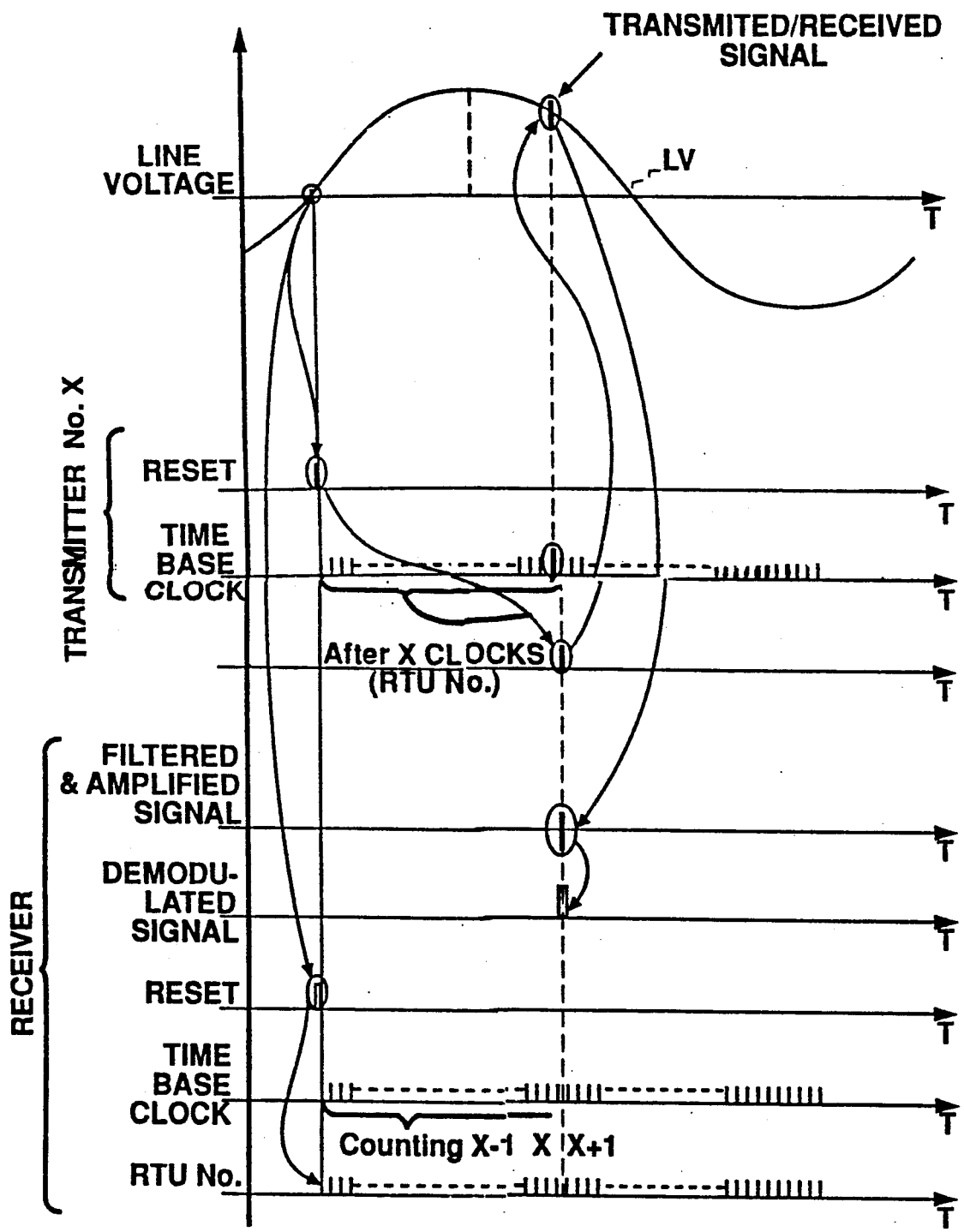
FIG. 4 is a timing diagram illustrating the operation of the apparatus of FIGS. 2 and 3.

The overall operation of system illustrated in FIGS. 2 and 3 will now be described particularly with reference to the timing diagram of FIG. 4.

Thus, the curve LV illustrates one full cycle or cycle of the line voltage in the power supply mains PSM, e.g., 50 Hz. The line sync detector $LSD_1$ in the remote transmitter unit $RTU_1$--$RTU_n$ detects the rising zero-crossing point of the voltage cycle to serve as the reference point for the time slots, and outputs a reset pulse at that instant to the timing counter $TC_1$. The timing counter, as controlled by the time base crystal TBC, divides the cycle into a plurality (e.g., 150) time slots, starting from this reference point.

A time slot is assigned to each of the remote transmitter units $RTU_1$--$RTU_n$. The data generated by the respective RTU appears on line 2 (FIG. 3), and the RTU number appears on line 4. The timing counter $TC_1$ receives the RTU number and outputs a trigger pulse at the beginning of the time slot assigned to the respective RTU. This trigger pulse is used for triggering the pulse transmitter PT, which injects a burst of pulses corresponding to the data appearing on line 2, into the line voltage at the proper time corresponding to the RTU number appearing on line 4.

Accordingly, during one complete cycle of the line voltage, there will be injected into it one bit of the data from each remote transmitter unit $RTU_1$--$RTU_n$ corresponding to the time slot assigned to the respective unit. If the data is a word of eight bits, eight cycles of the line voltage would be required to carry all the data.

The line voltage, carrying the so-injected data, is received by the band pass filter and amplifier BPFA, and also by the line sync detector $LSD_2$, of the central receiver unit CRU.

The line sync detector $LSD_2$ detects the same reference point of the line voltage, namely the rising zero-crossing point, as detected by the line sync detector $LSD_1$ in the transmitter control unit TCU. This detector periodically resets the timing counter $TC_2$, so that the latter outputs, via its line 8, a value representing the RTU number of the respective data received by the central receiver unit CRU.

The band pass filter and amplifier unit BPFA passes only the frequency of the pulse transmitters PT in the remote transmitter units $RTU_1$--$RTU_n$, so as to remove all disturbing noises. It amplifies this data, and then feeds it to the detector/demodulator unit DD, which extracts this data and outputs it via line 6.

Thus, the central receiver unit CRU outputs to the central processor unit CPU (FIG. 2) both the data, via line 6, and the RTU number via line 8. The central processor unit CPU may process this information in any desired manner, e.g., for billing, statistical or other purposes.

What is claimed is:

1. A one-way data telemetering system comprising: transmitter apparatus including a plurality of remote transmitter units connected via an alternating current power supply mains to a receiver apparatus including a central receiver unit for receiving data from the remote transmitter units; said transmitter apparatus comprising divider means for dividing each cycle of the line voltage into a plurality of time slots, detector means for detecting a predetermined point of each cycle of the line voltage to determine the start point of the first time slot, and transmitter means for transmitting to the power supply mains the data of each of said remote transmitter units in a separate time slot assigned to the respective transmitter unit; said central receiver unit comprising divider means synchronized by each cycle of the line voltage for dividing each cycle into a plurality of time slots corresponding to those of the transmitter apparatus, detector means for detecting a predetermined point of each cycle of the line voltage to determine the start point of the first time slot, and receiver means for separately receiving the data in the time slot of each respective remote transmitter unit; each of said transmitter units transmitting at least one bit of binary multi-bit digital data in its assigned time slot during each cycle of the line voltage of the power supply mains, whereby data may be transmitted one-way from each remote transmitter unit to the central receiver without the need for receiving any synchronization pulse from the receiver.

2. The system according to claim 1, wherein said transmitter means includes a radio-frequency pulse transmitter for transmitting the data of the respective remote transmitter unit in the form of radio-frequency pulses.

3. The system according to claim 2, wherein each transmitter unit transmits, in its respective time slot, pulses of one frequency to represent a binary "0" and of another frequency to represent a binary "1".

4. The system according to claim 2, wherein each transmitter unit transmits, in its respective time slot, no pulse to represent a binary "0", and a pulse of two frequencies to represent a binary "1".

5. The system according to claim 1, wherein said divider means of the transmitter apparatus comprises a line sync detector for detecting a predetermined point on each cycle of the line voltage to serve as the reference point for dividing the cycle into the plurality of time slots; and a timing counter periodically reset by the line sync detector and controlled by the assigned slot number of the respective remote transmitter unit to trigger the transmitter means to transmit the data of the respective remote transmitter unit to the power supply mains.

6. The system according to claim 5, wherein said divider means of the central receiver unit also comprises a line sync detector which detects the same predetermined point on each cycle of the power supply mains line voltage as detected in the transmitter apparatus to serve as the reference point for dividing the cycle into the plurality of time slots, and a timing counter reset by said latter line sync detector for outputting a signal corresponding to the assigned slot number of the data detected by said detector means.

7. The system according to claim 6, wherein said central receiver unit comprises a band pass filter for passing only the frequency of the transmitter means in the transmitter apparatus, and a detector/demodulator for receiving said data from the power supply mains line voltage passed by said band pass filter.

8. The system according to claim 1, wherein said transmitter apparatus and said central receiver unit each includes passive power supply means for supplying to the respective apparatus only power derived from the power supply mains.

9. The system according to claim 1, wherein the cycles of the power supply mains line voltage are divided into at least 50 time slots.

10. The system according to claim 1, wherein each of said remote transmitter units measures and transmits multi-bit digital data representing electrical consumption of a respective consumer.

11. A one-way data telemetering system comprising: transmitter apparatus including a plurality of remote transmitter units connected via an alternating current power supply mains to a receiver apparatus including a central receiver unit for receiving data from the remote transmitter units; said transmitter apparatus comprising divider means for dividing each cycle of the line voltage into a plurality of time slots, detector means for detecting a predetermined point of each cycle of the line voltage to determine the start point of the first time slot, and transmitter means for transmitting to the power supply mains the data of each of said remote transmitter units in a separate time slot assigned to the respective transmitter unit; each transmitter unit transmitting, in its respective time slot, pulses of one frequency to represent a binary "0" and of another frequency to represent a binary "1"; said central receiver unit comprising divider means synchronized by each cycle of the line voltage for dividing each cycle into a plurality of time slots corresponding to those of the transmitter apparatus, detector means for detecting a predetermined point of each cycle of the line voltage to determine the start point of the first time slot, and receiver means for separately receiving the data in the time slot of each respective remote transmitter unit; each of said transmitter units transmitting at least one bit of binary multi-bit digital data in its assigned time slot during each cycle of the line voltage of the power supply mains, whereby data may be transmitted one-way from each remote transmitter to the central receiver without the need for receiving any synchronization pulse from the receiver.

12. The system according to claim 11, wherein said transmitter means includes a radio-frequency pulse transmitter for transmitting the data of the respective remote transmitter unit in the form of radio-frequency pulses.

13. The system according to claim 11, wherein said divider means of the transmitter apparatus comprises a line sync detector for detecting a predetermined point on each cycle of the line voltage to serve as the reference point for dividing the cycle into the plurality of time slots; and a timing counter periodically reset by the line sync detector and controlled by the assigned slot number of the respective remote transmitter unit to trigger the transmitter means to transmit the data of the respective remote transmitter unit to the power supply mains.

14. The system according to claim 13, wherein said divider means of the central receiver unit also comprises a line sync detector which detects the same predetermined point on each cycle of the power supply mains line voltage as detected in the transmitter apparatus to serve as the reference point for dividing the cycle into the plurality of time slots, and a timing counter reset by said latter line sync detector for outputting a signal corresponding to the assigned slot number of the data detected by said detector means.

15. The system according to claim 11, wherein the cycles of the power supply mains line voltage are divided into at least 50 time slots.

16. A one-way data telemetering system comprising: transmitter apparatus including a plurality of remote transmitter units connected via an alternating current power supply mains to a receiver apparatus including a central receiver unit for receiving data from the remote transmitter units; said transmitter apparatus comprising divider means for dividing each cycle of the line voltage into a plurality of time slots, detector means for detecting a predetermined point of each cycle of the line voltage to determine the start point of the first time slot, and transmitter means for transmitting to the power supply mains the data of each of said remote transmitter units in a separate time slot assigned to the respective transmitter unit; each transmitter unit transmitting, in its respective time slot, no pulse to represent a binary "0", and a pulse of two frequencies to represent a binary "1"; said central receiver unit comprising divider means synchronized by each cycle of the line voltage for dividing each cycle into a plurality of time slots corresponding to those of the transmitter apparatus, detector means for detecting a predetermined point of each cycle of the line voltage to determine the start point of the first time slot, and receiver means for separately receiving the data in the time slot of each respective remote transmitter unit; each of said transmitter units transmitting at least one bit of binary multi-bit digital data in its assigned time slot during each cycle of the line voltage of the power supply mains.

17. The system according to claim 16, wherein said transmitter means includes a radio-frequency pulse transmitter for transmitting the data of the respective remote transmitter unit in the form of radio-frequency pulses.

18. The system according to claim 16, wherein said divider means of the transmitter apparatus comprises a line sync detector for detecting a predetermined point on each cycle of the line voltage to serve as the reference point for dividing the cycle into the plurality of time slots; and a timing counter periodically reset by the line sync detector and controlled by the assigned slot number of the respective remote transmitter unit to trigger the transmitter means to transmit the data of the respective remote transmitter unit to the power supply mains.

19. The system according to claim 18, wherein said divider means of the central receiver unit also comprises a line sync detector which detects the same predetermined point on each cycle of the power supply mains line voltage as detected in the transmitter apparatus to serve as the reference point for dividing the cycle into the plurality of time slots, and a timing counter reset by said latter line sync detector for outputting a signal corresponding to the assigned slot number of the data detected by said detector means.

20. The system according to claim 16, wherein the cycles of the power supply mains line voltage are divided into at least 50 time slots.

* * * * *